United States Patent [19]

Farmer

[11] Patent Number: 5,212,801
[45] Date of Patent: May 18, 1993

[54] APPARATUS FOR RESPONDING TO COMPLETION OF EACH TRANSITION OF A DRIVER OUTPUT SIGNAL FOR DAMPING NOISE BY INCREASING DRIVER OUTPUT IMPEDANCE

[75] Inventor: Charles Farmer, Austin, Tex.

[73] Assignee: Advanced Micro Devices, Inc., Sunnyvale, Calif.

[21] Appl. No.: 576,006

[22] Filed: Aug. 31, 1990

[51] Int. Cl.[5] .............................................. G06F 3/00
[52] U.S. Cl. ................................ 395/800; 364/932.8; 364/935.42; 364/DIG. 2; 307/443
[58] Field of Search .......................... 395/800; 307/443

[56] References Cited

U.S. PATENT DOCUMENTS

| | | | |
|---|---|---|---|
| 4,833,349 | 5/1989 | Liu et al. | 307/468 |
| 4,918,332 | 4/1990 | Nix | 307/270 |
| 4,948,991 | 8/1990 | Schucker et al. | 307/455 |
| 4,975,599 | 12/1990 | Petrovick, Jr. et al. | 307/443 |
| 5,083,051 | 1/1992 | Whatley et al. | 307/571 |
| 5,097,148 | 3/1992 | Gabara | 307/443 |
| 5,134,311 | 7/1992 | Biber et al. | 307/270 |

Primary Examiner—Thomas C. Lee
Assistant Examiner—Paul Harrity
Attorney, Agent, or Firm—Foley & Lardner

[57] ABSTRACT

An apparatus for controlling digital driver signals to accommodate a host system comprising a driver control circuit for generating a plurality of first stage gating signals in response to a data signal; a driver circuit generating a driver signal output in response to the plurality of first stage gating signals; and impedance control circuitry for controlling output impedance response of the driver circuit. The impedance control circuitry comprises a high signal impedance circuit for effecting such adjusting for low-to-high transitions of the driver signal, and a low signal impedance control circuit for effecting such adjusting for high-to-low transitions of the driver signal. The high signal impedance control circuit gates a first digital switching device operatively connected between the driver circuit output and a voltage source, and the low signal impedance control circuit gates a second digital switching device operatively connected between the driver circuit output and ground. The high signal impedance control circuit and the low signal impedance control circuit respond to transitions of the driver signal to enhance such transitions and establish the first and second digital switching devices in an off configuration when the transition is complete, thereby increasing output impedance of the driver circuit. In an alternate embodiment, the high signal impedance control circuit and the low signal impedance control circuit respond to completion of transitions of the driver signal to appropriately gate the first and second digital switching devices to lower output impedance of the driver circuit.

5 Claims, 1 Drawing Sheet

APPARATUS FOR RESPONDING TO COMPLETION OF EACH TRANSITION OF A DRIVER OUTPUT SIGNAL FOR DAMPING NOISE BY INCREASING DRIVER OUTPUT IMPEDANCE

CROSS REFERENCE TO RELATED APPLICATIONS (TT0081) U.S. patent application Ser. No. 07/576,060, filed Aug. 31, 1990; issued Jun. 18, 1991 as U.S. Pat. No. 5,025,181; entitled "Apparatus for Generating Digital Gating Signals in Response to a Digital Data Signal"; and (TT0082) U.S. patent application Ser. No. 07/576,610, filed Aug. 31, 1990; issued Jun. 18, 1991 as U.S. Pat. No. 5,025,182; entitled "Digital Apparatus for Generating Gating Signals in Response to a Data Signal".

BACKGROUND OF THE INVENTION

The present invention is directed to an apparatus for controlling digital driver signals to accommodate parametric requirements of a host system. Specifically, the present invention is directed to an apparatus for controlling output of a digital driver circuit, which apparatus is adaptable to accommodate parametric requirements of a host system in one of two general situations: (1) a requirement for fast transitions of the driver signal, and high direct current (DC) at the pad to which the driver signal is applied is not required, and (2) slow transition of the driver signal is desired with high DC requirements at the pad.

Fast transitions of driver output generate undesired electromagnetic noise in circuitry so that the preferred embodiment of the invention to accommodate situation (1) above further provides an increase in output impedance, seen from the pad, upon completion of the transition of the driver signal in order to effectively damp any noise which may have been caused by the fast transition occasioned by the apparatus.

SUMMARY OF THE INVENTION

The invention is an apparatus for controlling digital driver signals to accommodate a host system comprising a driver control circuit for generating a plurality of first stage gating signals in response to a data signal; a driver circuit generating a driver signal output in response to the plurality of first stage gating signals; and impedance control circuitry for controlling output impedance response of the driver circuit. The impedance control circuitry comprises a high signal impedance circuit for effecting such adjusting for low-to-high transitions of the driver signal, and a low signal impedance control circuit for effecting such adjusting for high-to-low transitions of the driver signal. The high signal impedance control circuit controls a first second stage gating signal which gates a first digital switching device operatively connected between the driver circuit output and a voltage source, and the low signal impedance control circuit controls a second second stage gating signal which gates a second digital switching device operatively connected between the driver circuit output and ground.

The high signal impedance control circuit and the low signal impedance control circuit respond to transitions of the driver signal to enhance such transitions and establish the first and second digital switching devices in an off configuration when the transition is complete, thereby increasing output impedance of the driver circuit. In an alternate embodiment, the high signal impedance control circuit and the low signal impedance control circuit respond to completion of transitions of the driver signal to appropriately gate the first and second digital switching devices to lower output impedance of the driver circuit.

Each of the high and low signal impedance control circuits comprises a control circuit having an odd number of inverting devices for generating a control signal in response to the driver signal, which control signal is the inverse of the driver signal. The control circuit further comprises an array of signal switching devices being gated by the control signal. A first and second signal switching device of the array of signal switching devices gatingly affect a second stage gating signal in response to the control signal. The array of signal switching devices further includes a third signal switching device which gatingly affects the second stage gating signal in response to an inverse antecedent signal of the first stage gating signal associated with the respective impedance control circuit.

An alternate embodiment of the present invention provides that the high and low impedance control circuits each comprises a control circuit having an even number of inverting devices for generating a control signal in response to the driver signal which is substantially in phase with the driver signal.

It is, therefore, an object of the present invention to provide an apparatus for controlling digital driver signals to accommodate a host system in accordance with parametric requirements of the host system.

A further objective of the present invention is to provide an apparatus for controlling digital driver signals to accommodate a host system which operates to enhance transitions of the driver signal and, upon completion of such transition, to increase output impedance of the driver circuit producing the driver signal.

Yet a further object of the present invention is to provide an apparatus for controlling digital driver signals to accommodate a host system which, upon completion of a transition of a driver signal, operates to lower the output impedance of the driver circuit producing the driver signal.

Further objects and features of the present invention will be apparent from the following specification and claims when considered in connection with the accompanying drawing illustrating the preferred embodiment of the invention.

DETAILED DESCRIPTION OF THE DRAWING

Figure 1:
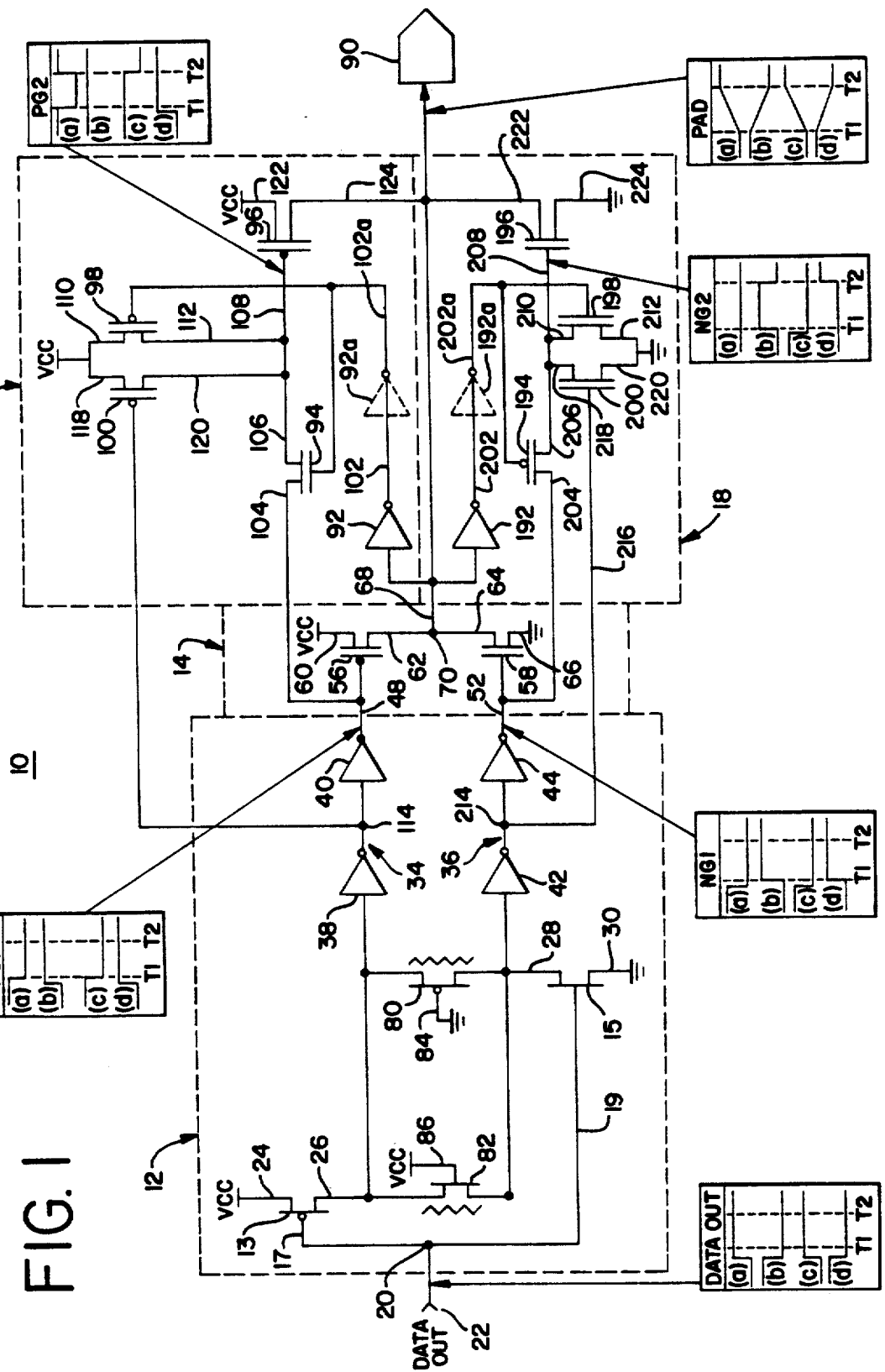

FIG. 1 is an electrical schematic diagram of the preferred embodiment of the present invention, with indications of wave forms at different locations within the apparatus.

DETAILED DESCRIPTION OF THE INVENTION

FIG. 1 is an electrical schematic diagram of the preferred embodiment of the present invention, with indications of wave forms at different locations within the apparatus. In FIG. 1, an apparatus 10 is illustrated comprising a driver control circuit 12, a driver circuit 14, a high signal impedance control circuit 16, and a low signal impedance control circuit 18.

In driver control circuit 12, a data signal DATA OUT is applied at an input pin 22 which is operatively connected with juncture 20. Juncture 20 is electrically common with gate 17 of P-channel FET 13 and gate 19 of N-channel FET 15. P-channel FET 13 is connected to gate a reference voltage VCC through its pole 24 to its pole 26 in response to signals applied to gate 17; N-channel FET 15 is connected to gate signals appearing at its pole 28 to ground through its pole 30 in response to signals applied to its gate 19. Intermediate pole 26 and pole 28 are parallel-connected FETs: P-channel FET 80 and N-channel FET 82. Gate 84 of P-channel FET 80 is connected to ground, thereby maintaining P-channel FET 80 in a gated-on condition. Similarly, gate 86 of N-channel FET 82 is connected to VCC, thereby maintaining N-channel FET 82 in a gated-on condition. Thus, there is presented between pole 26 of P-channel FET 13 and pole 28 of N-channel FET 15 a resistive array comprising the inherent resistance $R_1$ of P-channel FET 80 and the inherent resistance $R_2$ of N-channel FET 82 connected in parallel.

Electrically connected intermediate P-channel FET 13 and N-channel FET 82 is P-channel first stage gating signal drive line 34, and electrically connected intermediate N-channel FET 15 and P-channel FET 80 is N-channel first stage gating signal drive line 36. P-channel first stage gating signal drive line 34 includes inverter 38 and inverter 40; N-channel first stage gating signal drive line 36 includes inverter 42 and inverter 44.

A signal PG1, the P-channel first stage gating signal produced by driver control circuit 12 is produced at output 48 of inverter 40. Similarly, an N-channel first stage gating signal NG1 is produced by driver control circuit 12 at output 52 of inverter 44.

P-channel first stage gating signal PG1 and N-channel first stage gating signal NG1 are applied as inputs to driver circuit 14. Driver circuit 14 comprises P-channel FET 56 and N-channel FET 58 respectively gated by P-channel first stage gating signal PG1 and N-channel first stage gating signal NG1. P-channel FET 56 and N-channel FET 58 are connected to selectively gate a reference voltage VCC from a pole 60 to a pole 62 and, further, to gate signals appearing at a pole 64 to ground, through a pole 66. Driver circuit 14 produces a driver signal on output 68 from juncture 70 intermediate poles 62, 64.

Output 68 is applied to a pad 90 for connection with a host system (not shown). High signal impedance control circuit 16 is comprised of inverter 92, N-channel FET 94, P-channel FET 96, P-channel FET 98, and P-channel FET 100. Inverter 92 receives output 68 as an input and provides an output 102. Output 102 is applied to gate N-channel FET 94 and P-channel FET 98. N-channel FET 94 is connected to gate P-channel first stage gating signal PG1 from pole 104 to pole 106 in response to output 102 from inverter 92. Of course, output 102 is the inverse of output 68 from driver circuit 14. P-channel FET 98 is connected to gate a reference voltage VCC to gate 108 of P-channel FET 96 through poles 110, 112 in response to output 102 of inverter 92. P-channel FET 100 is gated by an antecedent inverse of P-channel first stage gating signal PG1 from juncture 114 via line 116 to gate reference voltage VCC to gate 108 of P-channel FET 96 through poles 118, 120. P-channel FET 96 is gated to connect reference voltage VCC to pad 90 through poles 122, 124.

Low signal impedance control circuit 18 is substantially a mirror image of high signal impedance control circuit 16. Specifically, low signal impedance control circuit 18 includes inverter 192, which receives output 68 as an input and produces an output 202. Output 202 gates P-channel FET 194 and N-channel FET 198. P-channel FET 194 is connected to gatingly connect N-channel first stage gating signal NG1 to gate 208 of N-channel FET 196 through poles 204, 206 in response to output 202 from inverter 192. N-channel FET 198 is configured to respond to output 202 from inverter 192 to gatingly connect gate 208 of N-channel FET 196 to ground through poles 210, 212. An inverse antecedent of N-channel first stage gating signal NG1 is provided from juncture 214 via line 216 to N-channel FET 200. N-channel FET 200 responds to signals received on line 216 to gatingly connect gate 208 of N-channel FET 196 to ground through poles 218, 220. N-channel FET 196 is connected to gatingly connect pad 90 to ground through poles 222, 224 in response to signals applied at gate 208.

Gate 108 of P-channel FET 96 carries P-channel second stage gating signal PG2, and gate 208 of N-channel FET 196 carries N-channel second stage gating signal NG2.

In the first embodiment of the present invention thus far described, apparatus 10 operates to momentarily enhance transitions of driver signals at output 68 (represented by signal PAD) momentarily and then, upon completion of such transition, to increase the output impedance of apparatus 10 in order to damp noise generated by the fast transition of signal PAD. Such an operating mode is preferable for applications in which apparatus 10 is to be employed for fast transitions of driver signals where high direct current (DC) is not required at pad 90.

Some applications require a slower transition of driver signal PAD and high DC current at pad 90. Such applications are addressed by an alternate embodiment of apparatus 10 wherein all elements are the same as previously described, except additional devices are added. Specifically, an additional inverter 92a is added in series with inverter 92 and produces an output 102a; and inverter 192a is connected in series with inverter 192 and produces an output 202a.

In FIG. 1, timing diagrams are presented for various signals: DATA OUT, P-channel first stage gating signal PG1, N-channel first stage gating signal NG1, P-channel second stage gating signal PG2, N-channel second stage gating signal NG2, and driver signal PAD. For each of the various signals for which timing diagrams are provided, there are four different timing diagrams. Signals designated (a) represent the respective signals when apparatus 10 is in its first embodiment configuration (with an odd number of inverters 92, 192 producing control signals 102, 202) when driver signal PAD transitions from low to high; signals designated by (b) correspond to operation of apparatus 10 in its first embodiment configuration when driver signal PAD transitions from high to low; signals designated by (c) correspond to operation of apparatus 10 in its second embodiment configuration (with an even number of inverters including inverters 92a, 192a which produce control signals 102a, 202a) when driver signal PAD transitions from low to high; and signals designated by (d) correspond to operation of apparatus 10 in its second embodiment configuration when driver signal PAD transitions from high to low.

In the case where apparatus 10 is in its first embodiment configuration and data signal PAD transitions from low to high, situation (a) of the various signals illustrated in FIG. 1 applies. Accordingly, in such situation, signal DATA OUT transitions from low to high before time $T_1$. As a consequence, N-channel first stage gating signal NG1 goes low prior to time $T_1$ and P-channel first stage gating signal PG1 goes low substantially at time $T_1$. Further, N-channel second stage gating signal NG2 remains low throughout, while P-channel second stage gating signal PG2 goes low at time $T_1$ and returns to a high value at time $T_2$. Driver signal PAD begins its transition from low to high at time $T_1$ and completes that transition at a high value at time $T_2$. As a result, with the downward momentary shift of P-channel second stage gating signal PG2, reference voltage VCC is momentarily gated to pad 90 to enhance "pull-up" of driver signal PAD, thereby speeding the transition of driver signal PAD from low to high. Such a speedy transition, however, generates undesired electromagnetic noise so that P-channel second stage gating signal PG2 shifts to high at time $T_2$ when driver signal PAD completes its low-to-high transition, thereby raising the output impedance of apparatus 10 to damp noise generated by the rapid transition of driver signal PAD.

In the situation where apparatus 10 is in its first embodiment configuration and driver signal PAD transitions from a high value to a low value, situation (b) applies for the various wave forms illustrated in FIG. 1. Accordingly, signal DATA OUT goes low at a time prior to time $T_1$, P-channel first stage gating signal PG1 goes high before time $T_1$, N-channel first stage gating signal NG1 goes high substantially at time $T_1$, and driver signal PAD begins its transition from high to low substantially at time $T_1$. P-channel second stage gating signal PG2 remains high throughout and N-channel second stage gating signal NG2 goes high at time $T_1$ and returns to a low value at time $T_2$. Thus, during transition of driver signal PAD from high to low, pad 90 is connected to ground through poles 222, 224 of N-channel FET 196, thereby enhancing and speeding the high-to-low transition of driver signal PAD. Such a rapid transition generates unwanted electromagnetic noise, thus N-channel second stage gating signal NG2 returns to a low value, thereby gating-off N-channel FET 196 and raising the output impedance of apparatus 10 to damp the electromagnetic noise generated by the rapid transition of driver signal PAD from high-to-low.

In the situation where apparatus 10 is in its second embodiment configuration and driver signal PAD transitions from low to high, diagrams denoted (c) apply in the various signal representations in FIG. 1. Accordingly, DATA OUT goes high prior to time $T_1$, N-channel first stage gating signal NG1 goes low prior to time $T_1$ and P-channel first stage gating signal PG1 goes low substantially at time $T_1$. Driver signal PAD begins a transition from low to high substantially at time $T_1$ and completes the transition at time $T_2$. N-channel second stage gating signal NG2 goes low prior to time $T_1$ and P-channel second stage gating signal PG2 goes low at time $T_2$. In such manner, by P-channel second stage gating signal PG2 going low at time $T_2$, the output impedance of apparatus 10 is lowered upon completion of the transition of driver signal PAD.

In the situation where apparatus 10 is in its second embodiment configuration and driver signal PAD transitions from high to low, diagrams denoted (d) apply in the various signal representations in FIG. 1. Accordingly, DATA OUT goes low prior to time $T_1$, N-channel first stage gating signal NG1 goes high substantially at time $T_1$, and P-channel first stage gating signal PG1 goes high prior to time $T_1$. Driver signal PAD begins a transition from high to low substantially at time $T_1$ and completes the transition at time $T_2$. P-channel second stage gating signal PG2 goes high prior to time $T_1$ and N-channel second stage gating signal NG2 goes high at time $T_2$. In such manner, by N-channel second stage gating signal NG2 going high at time $T_2$, the output impedance of apparatus 10 is lowered upon completion of the transition of driver signal PAD.

It is to be understood that, while the detailed drawings and specific examples given describe preferred embodiments of the invention, they are for the purpose of illustration only, that the apparatus of the invention is not limited to the precise details and conditions disclosed and that various changes may be made therein without departing from the spirit of the invention which is defined by the following claims.

I claim:

1. An apparatus for controlling digital driver signals to accommodate a host system; the apparatus comprising:

a driver control means for generating a plurality of gating signals in response to a received data signal;

a driver means for generating a driver signal at a driver output in response to said plurality of gating signals; said driver means being connected to said driver control means to receive said plurality of gating signals and impedance control means for adjusting output impedance of said driver means in response to transitions of said driver signal, said impedance control means being connected to said driver means to receive said driver signal, said impedance control means comprising a high signal impedance control means for effecting said adjusting for low-to-high transitions of said driver signal and a low signal impedance control means for effecting said adjusting for high-to-low transitions of said driver signal;

said high signal impedance control means being responsive to said driver signal for generating a first impedance control signal for controlling a first digital switching device to operatively connect said driver output with a voltage source;

said low signal impedance control means being responsive to said driver signal for generating a second impedance control signal for controlling a second digital switching device to operatively connect said driver output with ground; said high signal impedance control means and said low signal impedance control means responding to said transitions of said driver signal to reduce noise during said transition, said high signal impedance control means and said low signal impedance control means respectively establishing said first and second digital switching devices off substantially upon completion of each said transition of said driver signal to increase output impedance of said driver means.

2. The apparatus for controlling digital driver signals to accommodate a host system as recited in claim 1 wherein said high signal impedance control means and said low signal impedance control means cooperatively respond to each said completion of said transition of said driver signal to lower output impedance of said driver means.

3. The apparatus for controlling digital driver signals to accommodate a host system as recited in claim 1 wherein each of said high signal impedance control means and said low signal impedance control means comprises a control circuit, said control circuit being connected to said driver means for receiving said driver signal and comprising an odd number of inverting means for generating a control signal in response to said driver signal, said control signal being the inverse of said driver signal, said control circuit further comprising an array of signal switching devices operatively connected with said inverting means for receiving said control signal and being controlled by said control signal; a first and a second signal switching device of said array of signal switching devices each controlling said first impedance control signal or said second impedance control signal in response to said control signal.

4. The apparatus for controlling digital driver signals to accommodate a host system as recited in claim 3 wherein said array of signal switching devices further comprises a third signal switching device, said third signal switching device being operatively connected with said driver control means and controlling one of said first impedance control signal or said second impedance control signal in response to an inverse antecedent signal of a selected gating signal of said plurality of gating signals.

5. The apparatus for controlling digital driver signals to accommodate a host system as recited in claim 4 wherein said first digital switching device is a P-channel field effect transistor and said second digital switching device is an N-channel field effect transistor.

* * * * *